(12) United States Patent
Lee et al.

(10) Patent No.: US 7,348,262 B2
(45) Date of Patent: Mar. 25, 2008

(54) METHOD FOR FABRICATING MODULE OF SEMICONDUCTOR CHIP

(75) Inventors: Kyung-Lak Lee, Chungcheongbuk-do (KR); Ju-Il Lee, Chungcheongbuk-do (KR)

(73) Assignee: Magnachip Semiconductor, Ltd. (KR)

( * ) Notice: Subject to any disclaimer, the term of this patent is extended or adjusted under 35 U.S.C. 154(b) by 120 days.

(21) Appl. No.: 11/291,383

(22) Filed: Nov. 30, 2005

(65) Prior Publication Data

US 2006/0148232 A1 Jul. 6, 2006

(30) Foreign Application Priority Data

Dec. 30, 2004 (KR) .................. 10-2004-0115909

(51) Int. Cl.
*H01L 21/30* (2006.01)
*H01L 21/46* (2006.01)

(52) U.S. Cl. ............... 438/459; 438/613; 257/E21.237

(58) Field of Classification Search ............... 438/612, 438/613, 459; 257/E21.237
See application file for complete search history.

(56) References Cited

U.S. PATENT DOCUMENTS

| | | | |
|---|---|---|---|
| 6,281,106 B1 * | 8/2001 | Higdon et al. ............... 438/613 |
| 6,699,735 B2 * | 3/2004 | Ohuchi et al. ............... 438/113 |
| 6,753,238 B2 * | 6/2004 | Kurita ......................... 438/459 |
| 6,756,184 B2 * | 6/2004 | Peng et al. .................. 430/311 |
| 6,756,294 B1 * | 6/2004 | Chen et al. ................... 438/612 |
| 2003/0099907 A1 * | 5/2003 | Tei et al. ..................... 430/313 |
| 2005/0218497 A1 * | 10/2005 | Komuro ..................... 257/686 |
| 2006/0128135 A1 * | 6/2006 | Lin ............................. 438/613 |
| 2007/0045871 A1 * | 3/2007 | Lee ............................. 257/784 |

FOREIGN PATENT DOCUMENTS

JP 2003-168664 6/2003

* cited by examiner

*Primary Examiner*—George R. Fourson
*Assistant Examiner*—John M. Parker
(74) *Attorney, Agent, or Firm*—Blakely, Sokoloff, Taylor & Zafman

(57) ABSTRACT

A method for fabricating a module of a semiconductor chip is provided. The method includes the steps of: forming a bump on a substrate provided with a pad; forming a protection layer over the bump; performing a grinding process on a rear surface of the substrate to reduce a thickness of the substrate; and exposing the bump by removing the protection layer.

12 Claims, 4 Drawing Sheets

METHOD FOR FABRICATING MODULE OF SEMICONDUCTOR CHIP

FIELD OF THE INVENTION

The present invention relates to a method for fabricating a semiconductor chip module; and, more particularly, to a method for fabricating a semiconductor chip module including an image sensor module in bump type on a printed circuit board (PCB) of a mobile communication terminal.

DESCRIPTION OF RELATED ARTS

Recently, demands for digital cameras are increasing explosively along with the development of image communications through the internet. Furthermore, as mobile communication terminals with cameras such as personal digital assistants (PDAs), international mobile telecommuications-2000 (IMT-2000) terminals, and code division multiple access (CDMA) terminals are becoming widely used, the demands for small camera modules are increasing.

Examples of widely used camera modules include image sensor modules utilizing the basic element such as a charge coupled device (CCD) image sensor or a complementary metal-oxide-semiconductor (CMOS) image sensor. Recently, as the image sensors are becoming thinner and smaller, the image sensor modules are fabricated in bump type which are smaller in size when compared with wire bonding type image sensor modules.

However, referring to the wire bonding type image sensor module above, although it is inferior to the bump type image sensor module in size, it is possible to reduce the thickness of a bonding type image sensor wafer under 250 μm by applying a back grinding method. On the other hand, the bump type image sensor module requires an under bump metallurgy (UBM) layer formed through a series of sputtering processes, and this causes limitations in fabricating thin image sensor modules due to a minimum wafer thickness of 350 μm.

SUMMARY OF THE INVENTION

It is, therefore, an object of the present invention to provide a method for fabricating a micro-sized and ultra-thin semiconductor chip module in bump type.

In accordance with an aspect of the present invention, there is provided a method for fabricating a semiconductor chip module, including the steps of: forming a bump on a substrate provided with a pad; forming a protection layer over the bump; performing a grinding process on a rear surface of the substrate to reduce a thickness of the substrate; and exposing the bump by removing the protection layer.

BRIEF DESCRIPTION OF THE DRAWINGS

The above and other objects and features of the present invention will become better understood with respect to the following description of the specific embodiments given in conjunction with the accompanying drawings, in which.

DETAILED DESCRIPTION OF THE INVENTION

Figure 1:
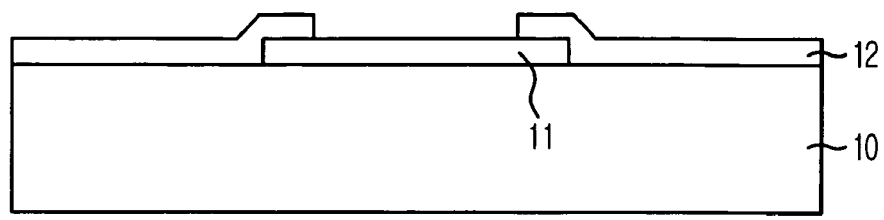
FIGS. 1 to 8 are cross-sectional views illustrating a method for fabricating a semiconductor chip module in accordance with one embodiment of the present invention.

A method for fabricating a module of a semiconductor chip in accordance with a specific embodiment of the present invention will be described in detail with reference to the accompanying drawings, which is set forth hereinafter.

FIGS. 1 to 8 are cross-sectional views illustrating a method for fabricating an image sensor module in accordance with a specific embodiment of the present invention. Herein, the figures are simplified, illustrating only a pad portion of a chip for the convenience of description below. Also, identical reference numerals among the reference numerals illustrated in FIGS. 1 to 8 represent identical elements with identical functions.

Referring to FIG. 1, a pad 11 is formed on a substrate 10 whereon an image sensor, although not illustrated, is fabricated. Herein, the pad 11 is formed by employing a conductive material. Preferably, aluminum (Al) is used.

Subsequently, a passivation layer 12 is formed over the substrate 10 and the pad 11, exposing a predetermined portion of the pad 11. Herein, the passivation layer 12 is formed by employing oxide or nitride-based materials.

Figure 2:
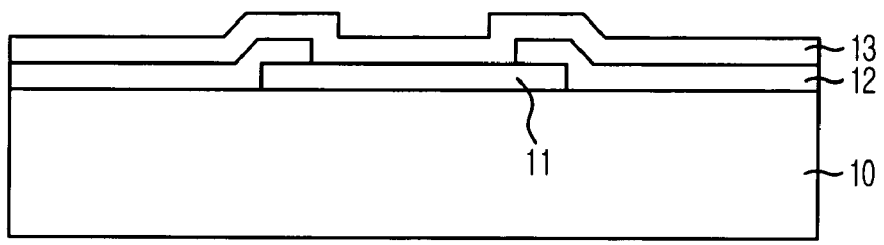

Referring to FIG. 2, an adhesion layer 13 is formed over the above resulting substrate structure including the passivation layer 12, the pad 11 and the substrate 10. Herein, the adhesion layer 13 is formed by employing an under bump metallurgy (UBM) layer through a sputtering method. Herein, the UBM layer 13 includes one of titanium (Ti), titanium tungsten (TiW) and gold (Au).

Figure 3:
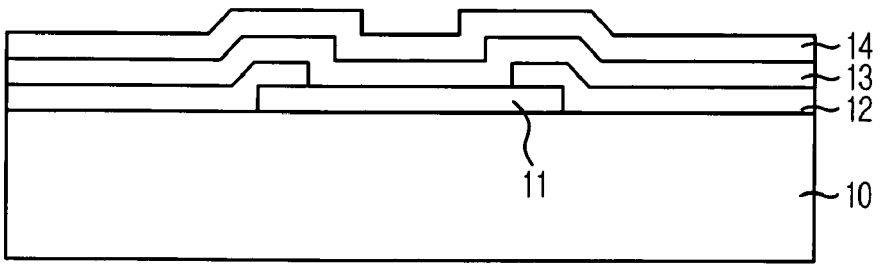

Referring to FIG. 3, a seed layer 14 is formed over the adhesion layer 13. Herein, the seed layer 14 is formed by employing a conductive material through a sputtering method. Preferably, gold (Au) is used.

Figure 4:
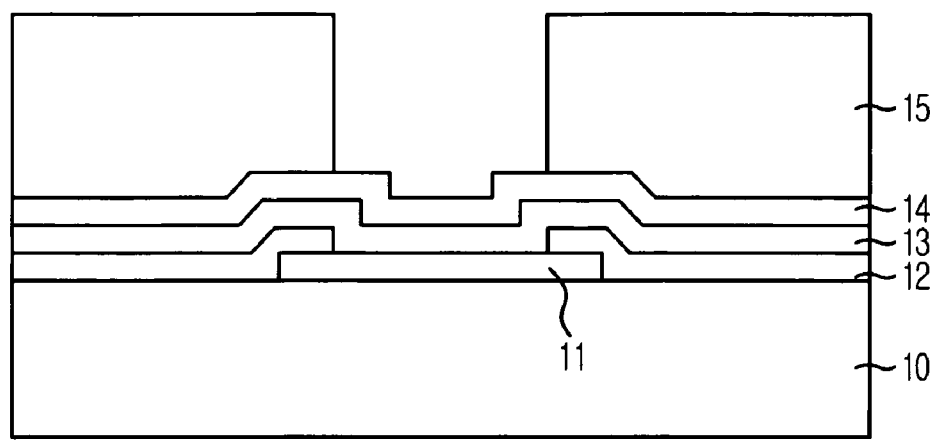

Referring to FIG. 4, a layer of photoresist is coated over an entire surface of the seed layer 14. Then, a photo-exposure process and a developing process are sequentially performed on the above resulting substrate structure by utilizing a photomask to form a photoresist pattern 15 with an opening that exposes a predetermined portion of the seed layer 14, corresponding to a predetermined portion of the pad 11.

Figure 5:
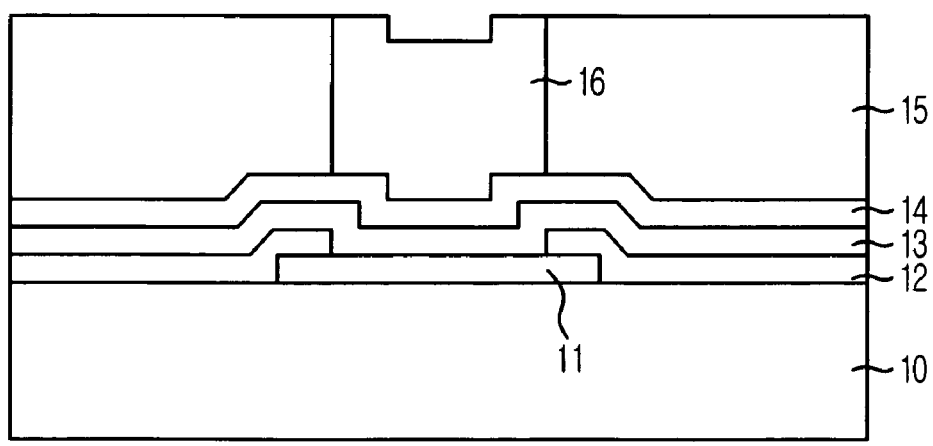

Referring to FIG. 5, a bump 16 is formed in the opening of the photoresist pattern 15. Herein, the bump 16 is formed by employing a conductive material through an electroplating method. Preferably, gold (Au) is used.

Figure 6:
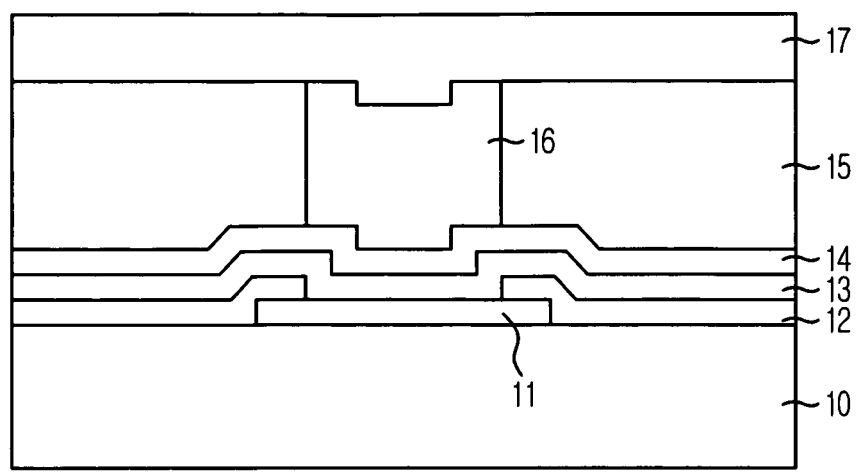

Referring to FIG. 6, a protection layer 17 is formed over the bump 16 and the photoresist pattern 15. Herein, the protection layer 17 is a coating material with certain viscosity which includes photoresist, gelatin, or resin. Preferably, photoresist is used. It is preferable to form the protection layer 17 in a uniform thickness that allows the bump 16 to be protected during a following grinding process, ranging from several micrometers to several tens of micrometers. Also, the protection layer 17 can be formed with tapings instead of the above-mentioned materials.

Figure 7:
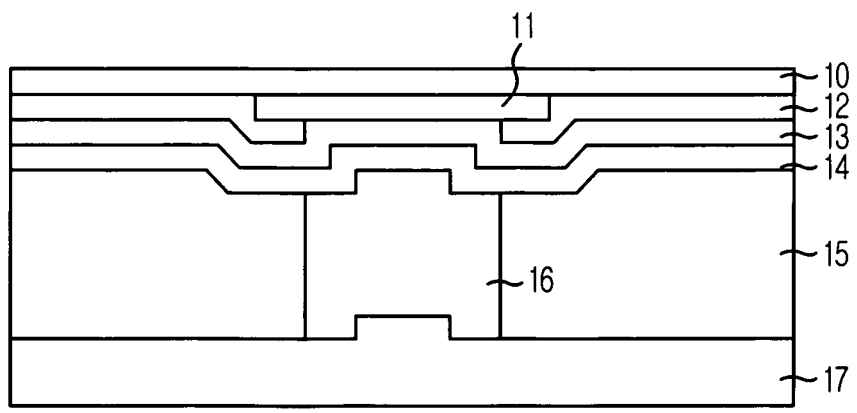

Referring to FIG. 7, the substrate 10 is polished by executing a backside grinding process. Herein, the substrate 10 is ground down to a thickness in a range of several tens of micrometers to approximately 250 μm. Meanwhile, after the backside grinding process, if the protection layer 17 is formed with tapings as mentioned above, the adhered tapes can be removed from the above resulting substrate structure by a strip process that is generally applied for the above mentioned coating materials.

Figure 8:
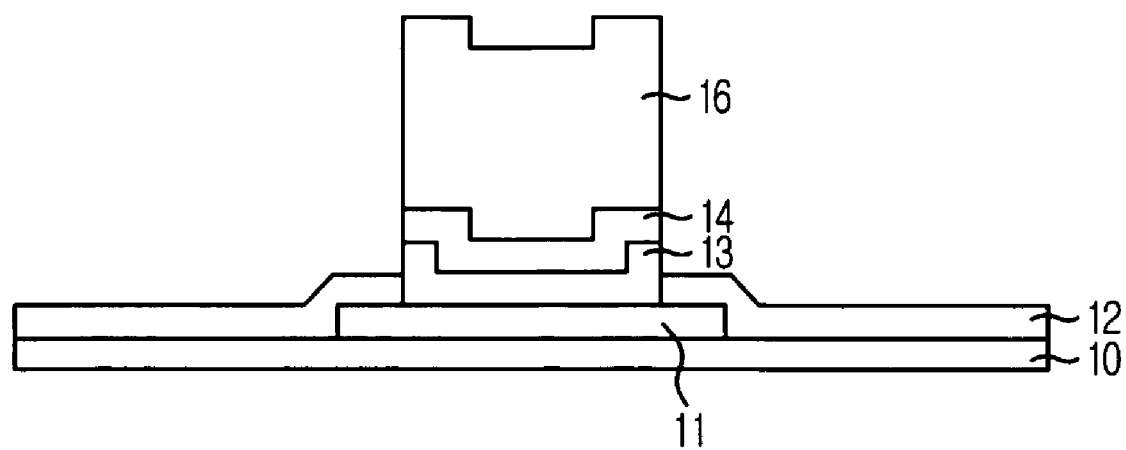

Referring to FIG. 8, the photoresist pattern 15 and the protection layer 17 are removed by the strip process.

Subsequently, predetermined portions of the seed layer 14 and the adhesion layer 13 are etched and removed through an etching process, exposing an upper surface of the passivation layer 12. Herein, the etching process is executed by employing an iodine-based solution and hydrogen peroxide ($H_2O_2$).

Although the specific embodiment of the present invention shows the case of fabricating the image sensor module, other bump type semiconductor chip modules can be applicable. Also, although the case of utilizing gold (Au) as the bump is shown in the above specific embodiment of the present invention, other types of materials that are used as bumps can be applicable.

Meantime, although the bump is formed by the electroplating method in the above specific embodiment of the present invention, an electroless nikel (Ni) plating method can be used as well. The electroless Ni plating method does not require a formation of the seed layer through a sputtering method, thereby resulting in a simplified process with low cost. However, the electroless Ni plating method has a conductivity level three times less than the electroplating method as the conductivity rates of Au and Ni are approximately $4.10 \times 10^7$ mohs/m and $1.45 \times 10^7$ mohs/m, respectively, and thus, there may be a higher chance of a signal loss. Herein, conductivity is a main quality of chip pads.

In accordance with the specific embodiment of the present invention, the bump and the protection layer for protecting the bump are formed on the substrate, completed with serial semiconductor chip fabrication processes and then, the backside of the substrate is ground to reduce the thickness of the substrate. This specific fabrication method makes it possible to realize micro-sized and ultra-thin semiconductor chips.

The present application contains subject matter related to the Korean patent application No. KR 2004-0115909, filed in the Korean Patent Office on Dec. 30, 2004, the entire contents of which being incorporated herein by reference.

While the present invention has been described with respect to certain specific embodiments, it will be apparent to those skilled in the art that various changes and modifications may be made without departing from the spirit and scope of the invention as defined in the following claims.

What is claimed is:

1. A method for fabricating a module of a semiconductor chip, comprising:
    forming a bump on a substrate provided with a pad;
    forming a photoresist protection layer over the bump;
    performing a grinding process on a rear surface of the substrate to reduce a thickness of the substrate; and
    exposing the bump by removing the protection layer.

2. The method of claim 1, further comprising an adhesion layer formed between the pad and the bump to strengthen the adhesive strength between the pad and the bump.

3. The method of claim 1, wherein the bump is formed by employing one of an electroplating method and an electroless nickel (Ni) plating method.

4. The method of claim 2, wherein the bump is formed by employing one of an electroplating method and an electroless nickel (Ni) plating method.

5. The method of claim 3, wherein if the electroplating method is employed, a seed layer is formed below the bump.

6. The method of claim 5, wherein the seed layer is formed by employing gold (Au).

7. The method of claim 4, wherein if the electroplating method is employed, a seed layer is formed below the bump.

8. The method of claim 7, wherein the seed layer is formed by employing gold (Au).

9. The method of claim 2, wherein the adhesion layer is formed by employing an under bump metallurgy (UBM) layer through a sputtering method.

10. The method of claim 9, wherein the UBM layer includes titanium (Ti), titanium tungsten (TiW) and gold (Au).

11. The method of claim 1, wherein the protection layer is removed by etching solutions including an iodine-based solution and hydrogen peroxide ($H_2O_2$).

12. The method of claim 1, wherein the semiconductor chip is an image sensor.

* * * * *